US008328564B2

(12) United States Patent
Regnier et al.

(10) Patent No.: US 8,328,564 B2

(45) Date of Patent: Dec. 11, 2012

(54) ELECTRICAL CONNECTOR SOLDER TERMINAL

(75) Inventors: Kent E. Regnier, Lombard, IL (US); Victor Zaderej, St. Charles, IL (US)

(73) Assignee: Molex Incoporated, Lisle, IL (US)

( * ) Notice: Subject to any disclaimer, the term of this patent is extended or adjusted under 35 U.S.C. 154(b) by 2368 days.

(21) Appl. No.: 10/461,296

(22) Filed: Jun. 13, 2003

(65) Prior Publication Data

US 2004/0253852 A1 Dec. 16, 2004

(51) Int. Cl.
*H01R 12/72* (2011.01)

(52) U.S. Cl. ........... 439/83; 439/342; 439/867; 439/876

(58) Field of Classification Search .................... 439/83, 439/342, 876, 867

See application file for complete search history.

(56) References Cited

U.S. PATENT DOCUMENTS 3,163,709 A * 12/1964 Fox .............................. 174/254
5,786,270 A * 7/1998 Gorrell et al. ................ 438/613
6,679,709 B2 * 1/2004 Takeuchi ........................ 439/83
2001/0045009 A1 11/2001 Cachina et al.
2003/0013330 A1 1/2003 Takeuchi

FOREIGN PATENT DOCUMENTS

GB 2 023 944 A 1/1980
WO WO 02/17436 A1 2/2002

OTHER PUBLICATIONS

International Search Report and Written Opinion of International. Searching Authority, mailed Sep. 21, 2004.

* cited by examiner

*Primary Examiner* — James Harvey

(74) *Attorney, Agent, or Firm* — Stephen L. Sheldon

(57) ABSTRACT

A connector is provided for mounting a module to a printed circuit board. The connector includes a housing having end walls defining a slot for receiving a module. Terminals are mounted within the housing on either side of the slot. Each terminal includes a tail. A solder mass is attached to each tail and is used to bond the connector to the printed circuit board. The solder mass is attached to each tail without the use of a reflow process. The solder mass can be attached to the tail of the terminal either through a mechanical attachment or through bonding. A reflow process is then used to attach the connector to the printed circuit board.

5 Claims, 7 Drawing Sheets

ELECTRICAL CONNECTOR SOLDER TERMINAL

FIELD OF THE INVENTION

This invention is directed to an electrical connector and, in particular, to a solder terminal for use in an electrical connector and a method of making such a solder terminal for use in an electrical connector.

BACKGROUND OF THE INVENTION

Typical surface mounted connectors include a plurality of terminals and solder masses associated with each terminal. Each solder mass is typically in the shape of a ball and during assembly of the connector, the each solder mass is attached to a respective terminal using a reflow process. Upon assembly of the connector to a printed circuit board a second reflow process is typically used to fuse the terminals to contact pads on the circuit board by way of the solder mass.

It is important that the solder mass be securely attached to the terminal. This is so because the connectors using such solder terminals are generally shipped from one location to another location prior to the electrical connectors being installed on a circuit substrate, such as a printed circuit board. Thus, it is necessary to have sufficient retention of the solder mass to the terminal to ensure that the solder mass is not disengaged from the terminal during transportation. One known method of retaining the solder mass to a terminal is by fusing the solder mass to the terminal through the use of a reflow type process.

OBJECTS AND SUMMARY OF THE INVENTION

A primary object of the present invention is to provide a novel solder bearing terminal.

Another object of the present invention is to provide a method of making the solder bearing terminal.

Another object of the present invention is to provide an electrical connector that uses the solder bearing terminal, and which can be securely mounted to a circuit substrate, such as a printed circuit board.

An object of an embodiment of the present invention is to provide a mechanical engagement between the terminals of the electrical connector and the solder mass provided in the respective terminal.

An object of an embodiment of the present invention is to provide an adhesive engagement between the terminals of the electrical connector and a solder mass.

Yet another objection of the present invention is provide attachment of the solder masses to the terminals without using a reflow process.

Still another object of the present invention is to provide an efficient method for mounting a connector to a printed circuit board.

Briefly, and in accordance with the foregoing, a connector is provided in which a solder mass is securely attached to the tail end of each terminal of the connector. In one embodiment of the present invention, attachment of the solder mass is achieved through a mechanical engagement between the solder mass and the terminal. In another embodiment, the solder mass is securely retained to the terminal by a plating process. In yet another embodiment of the present invention, attachment of the solder mass is achieved through an adhesive engagement between the solder mass and the terminal. The securement of the solder mass can be accomplished by any of the above methods, individually, or by a combination of one or more of the above mechanisms. In each embodiment, engagement of the solder mass and the terminals is achieved without the use of a reflow process.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

Figure 1:
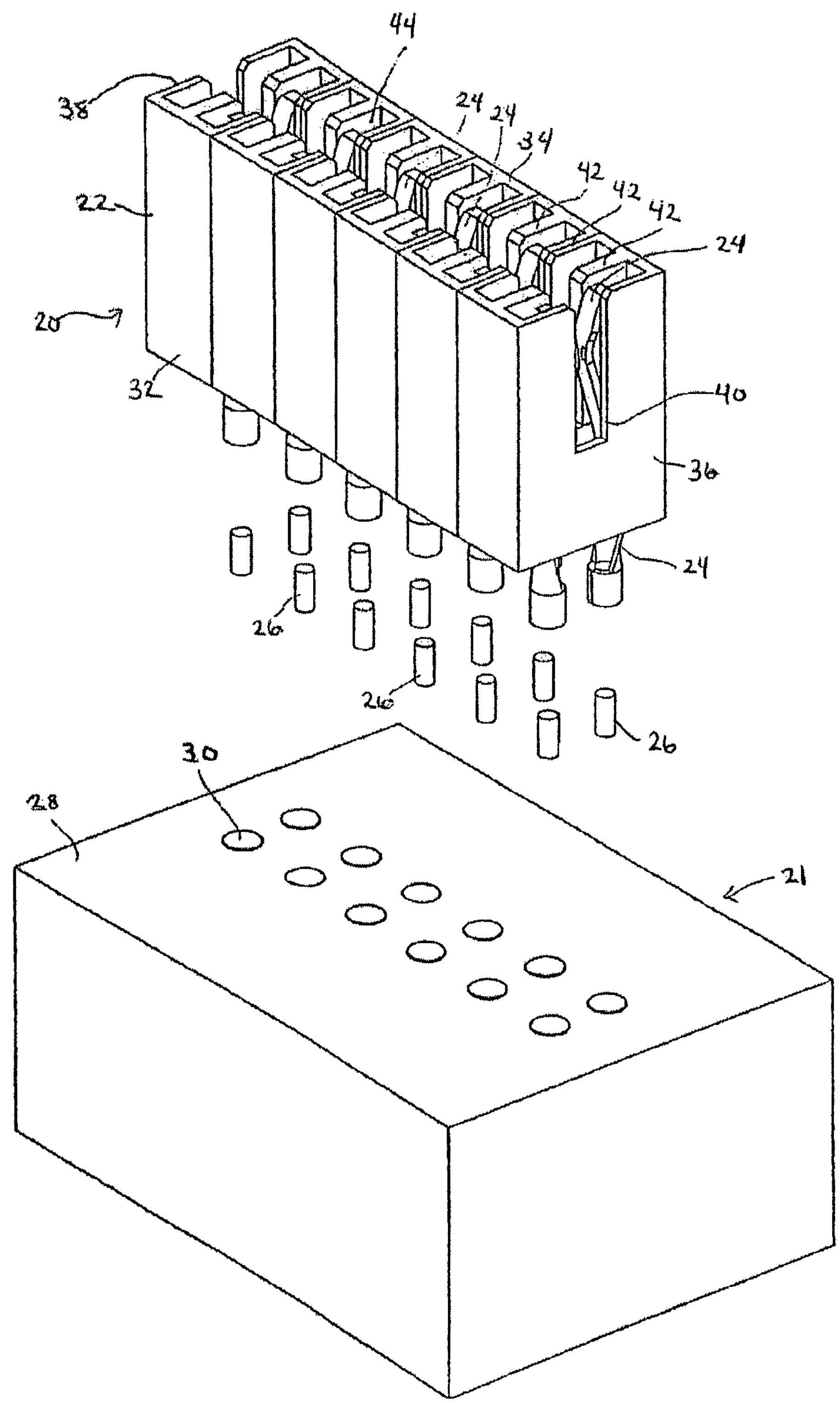
FIG. 1 is an exploded perspective view of a connector which incorporates the features of a first embodiment of the invention and a circuit board to which the connector is to be attached.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

A connector 20 for attachment of a module (not shown) to a printed circuit board 21 is provided. The module may be, for example, a voltage regulator module, a memory module, interface card, or some other type of auxiliary card or daughter circuit card. As shown in FIG. 1, the connector 20 includes a housing 22, a plurality of terminals 24 positioned within and extending from the housing 22, and a plurality of solder masses 26. The printed circuit board 21 includes a plurality of contact pad 30 aligned with the plurality of terminals 24.

The housing 22 is formed of an insulative material and includes a pair of side walls 32, 34 having opposite ends and a pair of end walls 36, 38 provided at each end of the side walls 32, 34 and generally perpendicular to the side walls 32, 34. An elongated slot 40 extends from the front edge of the end walls 36, 38 and is generally parallel to the side walls 32, 34. The slot 40 receives an edge of the module. A plurality of inner walls 42 extend perpendicularly from the inner surfaces of the side walls 32, 34. Terminal receiving passageways 44 are thus formed between the inner walls 42 and between the inner surfaces of the side walls 32, 34.

The terminals 24 are mounted within the terminal receiving passageways 44. The terminals 24 extend generally parallel to the end walls 36, 38. The terminals 24 are generally formed from metal, such as, for example, copper using a stamping process and then formed into the shape described herein. Alternatively the terminals can be formed from plastic which is then plated with a conductive material, such as metal.

Figure 7:
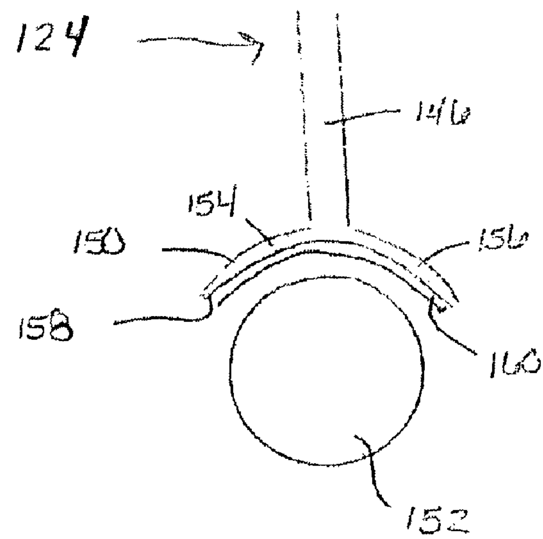
FIG. 7*a* is a side elevational view of a portion of a terminal of an electrical connector made in accordance with a second embodiment of the invention along with a side elevational view of a solder mass to be attached to the terminal.
FIG. 7*b* is a side elevational view of a portion of a terminal of an electrical connector made in accordance with a second embodiment of the invention along with a side elevational view of a solder mass to be attached to the terminal.
Figure 7:
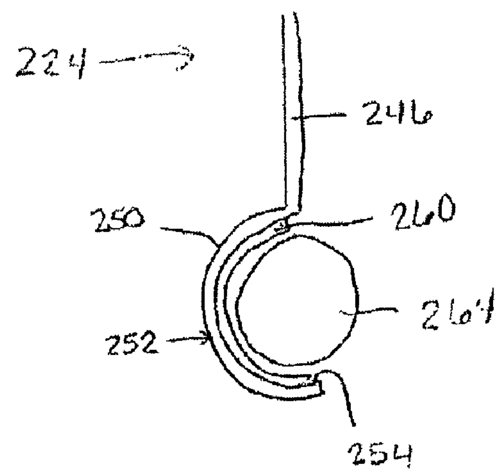
Figure 8:
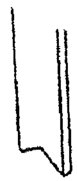
FIGS. 8*a*-8*f* are perspective views of different types of terminal tails.

A solder mass 26 is attached to each terminal 24 using the methods described herein. A first embodiment of the invention is shown in FIGS. 2-6. A second embodiment of the present invention is shown in FIGS. 7-8.

Figure 2:
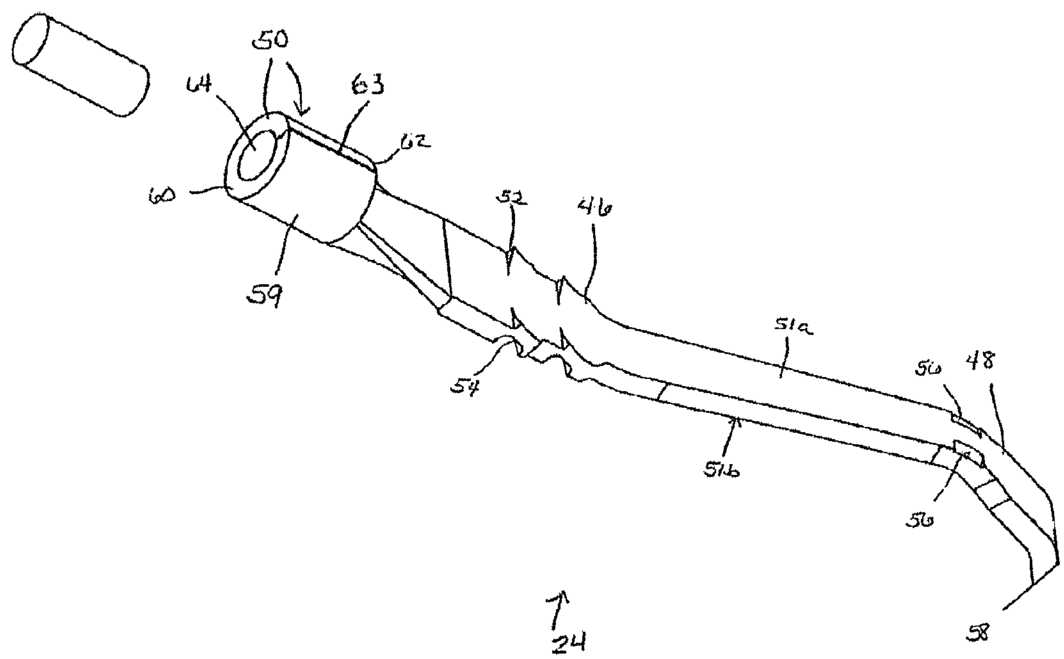
FIG. 2 is an exploded perspective view of one of the terminals of the connector shown in FIG. 1.

Attention is now invited to FIG. 2 in which a terminal 24 is shown in greater detail. Each terminal 24 includes a central portion 46, a contact portion 48 and a tail portion 50. Each terminal 24 includes a proximal surface 51*a* and a distal surface 51*b*. A tip 58 is provided at the outer end of each contact portion 48. The tip 58 is angled relative to the remainder of the contact portion 48.

The central portion 46 of the terminal extends between the contact portion 48 and the tail portion 50. The central portion 46 is generally elongated and includes outwardly protruding barbs 52 and recesses 54 for mounting the terminals 24 within the housing 22. The central portion 46 is generally rectangularly-shaped proximate the contact portion 48 and is tapered proximate the tail portion 50.

The tail portion 50 of each terminal 24 includes a generally tubular-shaped wall 59 having opposite first 60 and second 62 ends. A slit 63 is provided in the tubular-shaped wall 59 and extends from the first end 60 to the second end 62. A generally cylindrically-shaped passageway 64 is defined by the interior surface of the wall 59 and extends from the first end 60 of the wall 59 to the second end 62 of the wall 59.

A solder mass 26 is associated with each terminal 24 of the connector 20. The solder mass 26 is a generally cylindrically shaped slug. The diameter of the solder mass 26 is approximately the same as the diameter of the passageway 64 of the tail portion 50. The generally tubular portion can be formed either prior to the solder mass being inserted into the tubular portion, or the tubular portion can be formed around the solder mass.

Figure 3:
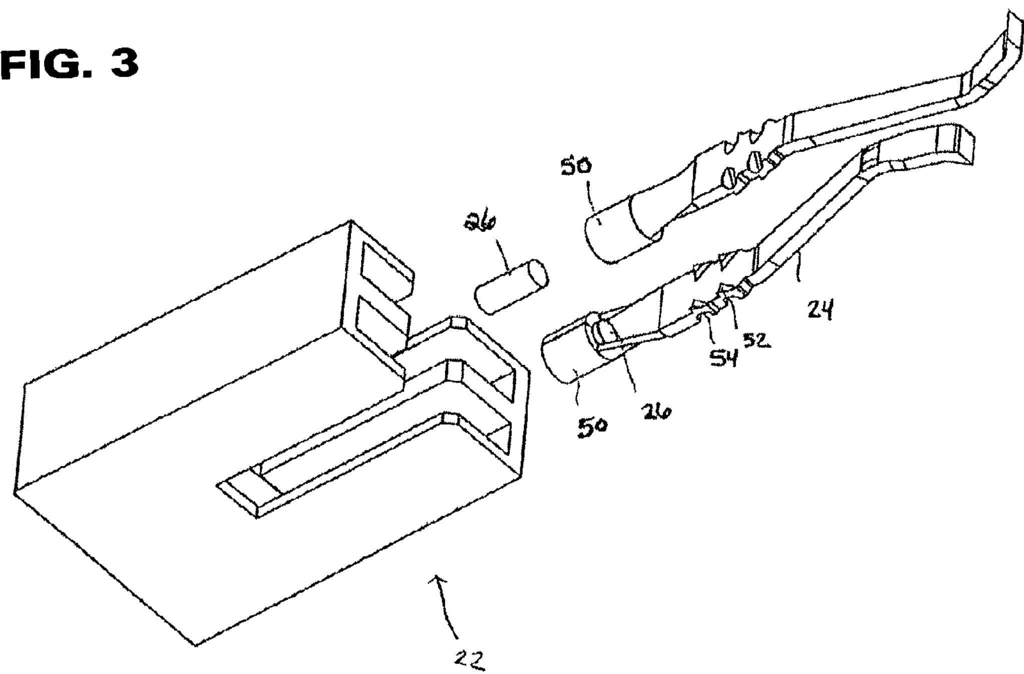
FIG. 3 is a partially exploded perspective view of two of the terminals of the connector shown in FIG. 1 and a portion of the housing of the connector.
Figure 4:
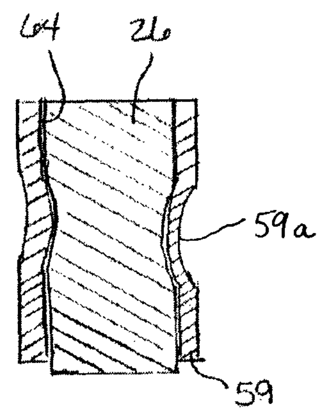
FIGS. 4*a*-4*c* are cross-sectional views of the tail portion of a terminal and a solder mass illustrating a variety of methods of mechanically attaching the tail portion of the terminal with the solder mass.
Figure 4:
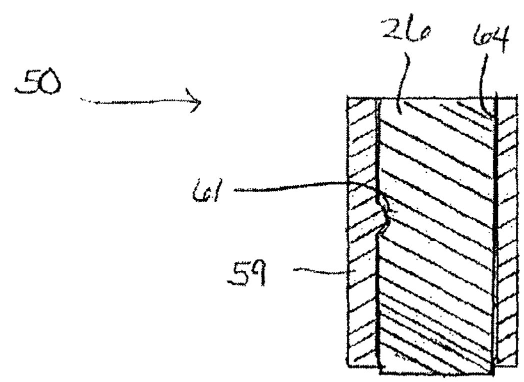
Figure 4:
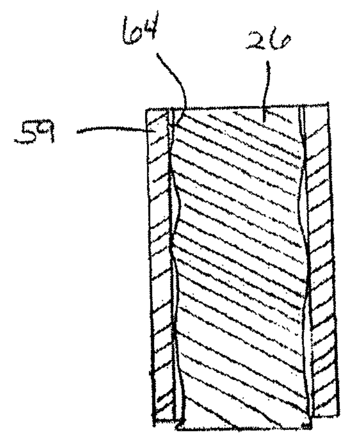

Attention is now invited to FIG. 3 in which a portion of the housing 22 is shown along with two terminals 24. Assembly of the connector 20 includes mounting the terminals 24 within the housing 22. Prior to mounting the terminals 24 within the housing 22, a solder mass 26 is inserted within each terminal passageway 64 and is mechanically attached to the tail portion 50 of the terminal 24. A reflow process is not used to attached the solder mass 26 to the terminal 24. As shown in FIG. 3, mechanical attachment of the solder mass 26 within the passageway 64 results in the encapsulation of the solder mass 26 by the tail portion 50 of the terminal 24.

As shown in FIGS. 4*a*-4*c* a variety of methods can be used to mechanically attach the solder mass 26 to the terminal 24. One method of mechanically attaching the solder mass 26 and the terminal 24 shown in FIG. 4*a* is crimping. For example, the solder mass 26 and terminal 24 can be mechanically attached by placing the solder mass 26 within the passageway 64 and then crimping the wall 59 of the tail portion 50 and the solder mass 26 to retain the solder mass 26 within the passageway 64. This will cause the wall 59 to deform 59*a* and engage the solder mass 26.

Another method of mechanically attaching the solder mass 26 and terminal 24 shown in FIG. 4*b* includes providing a surface interruption 61 between the solder mass 26 and the terminal 24. For example, at least one dimple 61 or barb is provided in the wall 59 When the solder mass 26 is placed within the passageway 64 the dimple on the wall 59 engages the solder mass 26 to retain the solder mass 26 within the passageway 64.

Yet another method of mechanically attaching the solder mass 26 and terminal 24 shown in FIG. 4*c* includes cold forming the solder mass 26 within the passageway 64 of the terminal 24. The second end 62 is blocked by a removable member and solder is forced into the passageway 64 through the first end 60. As the solder mass 26 is forced within the passageway 64, the solder mass 26 expands outwardly and engagement is provided between the solder mass 26 and the wall 59.

Figure 5:
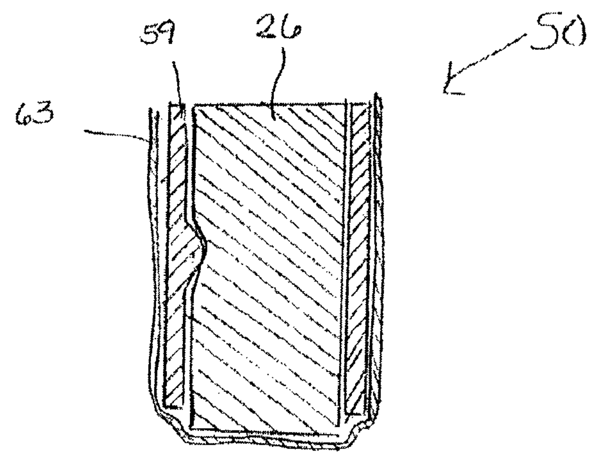
FIG. 5 is a cross-sectional view of the tail portion of a terminal and a solder mass which have been plated.

As shown in FIG. 5, to further enhance the attachment between the tail portion 50 of the terminal 24 and the solder mass 26, subsequent to the mechanical attachment processes described above, a plating process can be used in which the assembled terminal 24 and solder mass 26 are simultaneously plated. Such plating 63 is typically performed with a metal, such as, for example, a precious metal, tin or lead. Alternatively, the solder mass 26 may be retained within the passageway 64 by nothing more than a plating material 63.

After attachment of a solder mass 26 with each of the tail portions 50 of the terminals 24, the terminals 24 are mounted within the housing 22. The barbs 52 and the recesses 54 are engaged with corresponding structure within the housing 22 to secure the terminals 24 within the housing 22.

Figure 6:
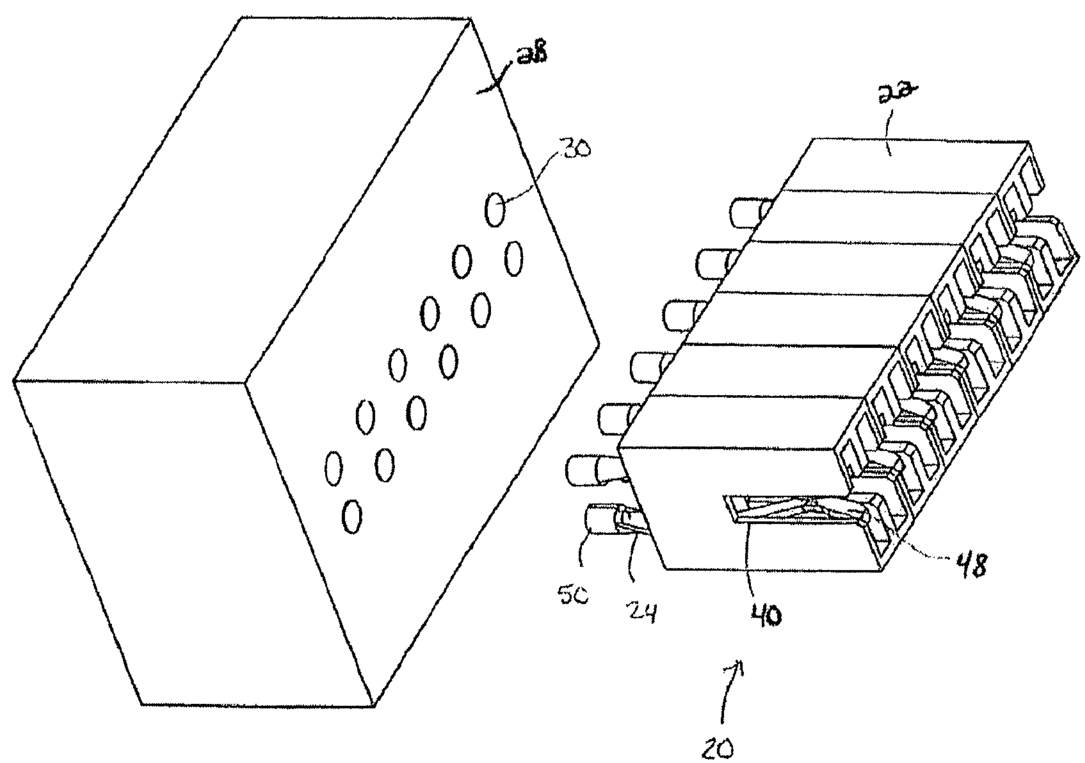
FIG. 6 is an perspective view of the connector of FIG. 1, shown in an assembled state, and ready for attachment to the printed circuit board which is shown exploded therefrom.

Attention is now invited to FIG. 6. When the terminals 24 are mounted to the housing 22, the contact portions 48 of the terminals 24 are located within the housing 22 such that a portion of each of the terminals 24 can contact the edge of a module which is inserted within the slot 40. The tail portions 50 of the terminals 24 extend rearwardly of the housing 22 and are aligned with the contact pads 30 on the circuit board 28.

To attach the connector 20 to the printed circuit board 28, the tail portions 50 of the connector 20 are placed in contact with the contact pads 30 on the printed circuit board 28. A reflow process is then performed, wherein the tail portions 50 of the terminals 24, along with the solder masses 26 encapsulated therein, are heated until the solder mass 26 melts and a solder joint is formed between the tail portions 50 of the terminals 24 and the contact pads 30 of the printed circuit board 28.

Mechanically attaching the solder masses 26 to the tail portions 50 of the terminals 24 eliminates the need for a reflow process for the purpose of attaching the solder mass 26 to the terminal 24. Thus, a heating step is eliminated resulting in a more efficient manufacturing process. A reflow process is then used to fuse the solder masses 26, terminals 24 and the contact pads 30 of the printed circuit board 28.

The solder mass 26 provides a greater volume and mass of solder than that used to form a joint under the prior art methods which, for example, use a standard SMT foot. The encapsulated solder mass 26, promotes the ability to provide a proper solder filet to obtain a more robust attachment and a more reliable joint between the connector 20 and the printed circuit board 28. By plating the encapsulated solder mass 26 and terminal 24 the attachment between the solder mass 26 and terminal 24 can be further enhanced. Plating in this manner is particularly useful when the connectors are to be shipped as further protection is provided to the bond between the solder masses 26 and the terminals 24.

Although the tail portions 50 of the terminals 24 have been shown and described as tubularly shaped and the solder masses 26 have been shown as cylindrically shaped, the tail portions 50 and the solder masses 26 can be shaped in any configuration which allows for mechanical engagement between the tail portions 50 and the solder mass 26 and the substantial encapsulation of the solder mass 26, so long as a reflow process is not necessary.

A second embodiment of the present invention is shown in FIGS. 7*a* and 7*b*. As shown in FIG. 7*a* the terminal 124 includes a central portion 146 and a tail portion 150 extending from the central portion 146. Similar to the first embodiment shown in FIGS. 1-6, a plurality of terminals 124 are mounted within a housing to form a connector. The tail portion 150 of each terminal 124 is to be attached to a solder mass 152, which will then be attached to the contact pads on a printed circuit board.

The terminal 124 is generally formed from metal, such as, for example, copper using a stamping process and then formed to the shape described herein. Alternatively, the terminal 124 is formed from plastic which is plated with a conductive material, such as a metal. The tail portion 150 of the terminal 124 includes two curved fingers 154, 156 which extend from opposite sides of the terminal 124. A surface 158 nearest the mounting surface 28 of the PCB 21 is formed by the finger 154, 156.

A bonding agent 160, such as the bonding agent commonly referred to as sticky flux, is provided on the surface 158 of the tail portion 150. The solder mass 152, which is spherically shaped, is then brought into contact with the sticky flux 160 to securely attach the solder mass 152 to the tail portion 150 of the terminal 124.

To attach the terminals to the printed circuit board, the solder mass 152 is placed in contact with the contact pads on the printed circuit board. A reflow process is then performed, wherein the tail portions 150 of the terminals 124 and the solder mass 152 are heated until the solder mass 152 melts and a solder joint is formed between the tail portions 150 of the terminals 124 and the contact pads of the printed circuit board.

Bonding the solder mass 152 to the tail portions 150 of the terminals 124 using sticky flux eliminates the need to use a reflow process at the time when the solder mass 26 is engaged to the tail 150 of the terminal 124. As with the first embodiment described above, a heating step is eliminated and as a result the manufacturing process is more efficient than processes which require reflow in order to attach the solder mass 152 to the tail portion 150 of the terminals 124.

Alternatively, rather than applying the sticky flux to the rear surface 158 of the tail portion 150, the sticky flux can be pre-applied to the solder mass 152. In the event that sticky flux is pre-applied to the solder mass 152, the sticky flux must be activated prior to attaching the solder mass 152 to the tail portion 150 of the terminal. To activate the sticky flux, the temperature of the solder masses 152 is elevated and volatiles are driven off the solder masses 152 by tumbling and heating the solder masses 152. Thereafter the solder mass 152 is placed in contact with the respective tail portion 150 of the terminals 124 and bonds thereto. Although activation of the sticky flux requires heat, the temperatures required to activate the sticky flux are lower than the temperatures required to perform the reflow process. Therefore, in the event solder masses with pre-applied sticky flux are used, an elevation of temperature, such as that required to perform reflow, is not required in order to bond the solder mass 152 with the terminal 124. Thus, a more efficient manufacturing process results.

An example of an alternatively shaped terminal 224 of a connector made in accordance with a second embodiment of the present invention is shown in FIG. 7*b*. The terminal 224 includes a center portion 246 and a tail portion 250. The tail portion 250 of the terminal 225 is hook shaped with a curved outer surface 252 and a curved inner surface 254. Sticky flux 260 is applied to the inner surface 254. A solder mass 264 is placed in contact with the sticky flux 260 and bonded to the tail portion 250 of the terminal 224.

Two tail portions 150, 250 have been shown and described with respect to the second embodiment of the present invention. The invention, however, allows the tail portion of the terminal to be shaped in any manner which allows for bonding of the solder mass using sticky flux. A sampling of different tail portions which could be used in connection with the present invention is shown in FIGS. 8*a*-8*f*. Likewise, although the solder masses 152, 264 shown in FIGS. 7*a* and 7*b* are each spherically shaped, the solder mass can be formed in essentially any shape. Preferably, the solder mass is formed in a shape which corresponds to the shape of the tail portion of the terminal with which it will be used. In addition, it is preferred that there is at least 25% surface engagement between the terminal and the solder mass.

To further enhance the attachment between the tail portions 150 of the terminals 124 and the solder mass 152, or the tail portion 250 of the terminal 224 and the solder mass 264, a plating process can be used in which the assembled terminal 124 and the solder mass 152 or the assembled terminal 224 and solder mass 264 are simultaneously plated. Such plating is typically performed with a metal, such as, for example, tin or lead.

Figure 9:
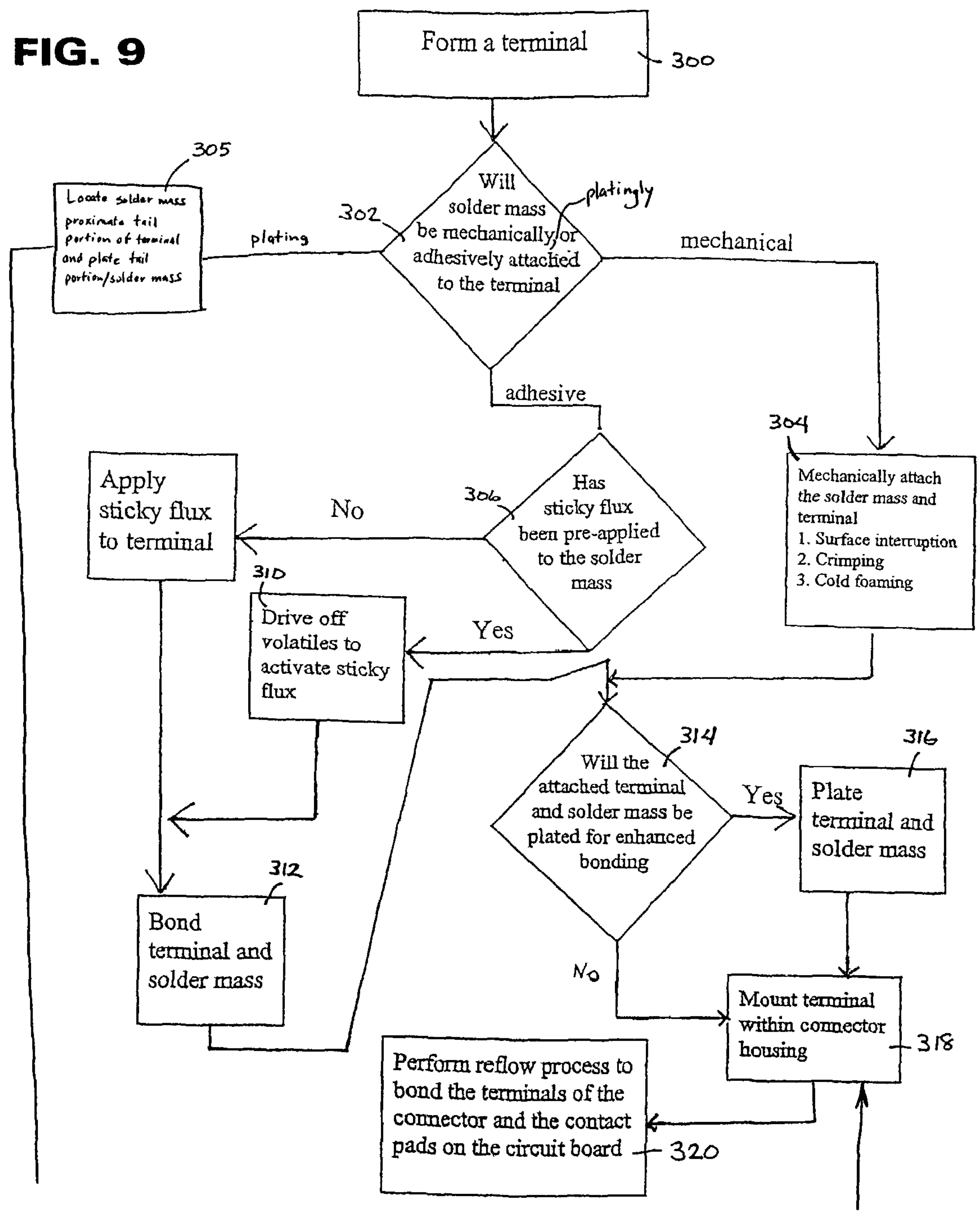
FIG. 9 is a schematic which represents the method of attaching a solder mass and a terminal in accordance with the present invention.

As shown in FIG. 9, the method of attaching a terminal to a solder mass in accordance with the present invention begins with the step 300 of forming a terminal. Next, it must be determined if a mechanical attachment, plating attachment or a bonding attachment is to be used as represented by step 302.

If a mechanical attachment is to be used the next step 304 is to mechanically attach the solder mass and the terminal. The mechanical attachment can be achieved in a variety of ways, such as, for example, using surface interruptions on the solder mass and the terminal, crimping the solder mass and the terminal, or cold forming the solder mass and the terminal. Each of these mechanical attachment methods has been described in detail above.

If a plating attachment is to be used, the next step 305 is to locate the solder mass proximate to the tail portion of the terminal. The tail portion and the solder mass are then plating in such a manner that the plating process retains the solder mass to the tail portion of the terminal.

If bonding attachment between the tail portion of the terminal and the solder mass is to be used, it must then be determined if a bonding agent has been pre-applied to the solder mass, as represented by step 306 in FIG. 9. If the bonding agent has not been pre-applied to the solder mass, the bonding agent is to be applied to the terminal, as represented by step 308 in FIG. 9. If a bonding agent has been pre-applied to the solder mass, the pre-applied bonding agent is to be activated, as represented by step 310. The bonding agent is activated by, for example, tumbling and heating the solder mass. Subsequent to applying the bonding agent to the terminal or activating the bonding agent on the solder mass, the terminal and the solder mass are placed in contact with each other and thereby bonded together, as represented by step 312.

After attachment (using either the mechanical or adhesive steps), it must be determined whether the attachment between the solder mass and the terminal will be enhanced by plating, as represented by step 314. If the attachment is to be enhanced, the attached solder mass and terminal are plated, as represented by step 316.

With the solder mass and terminal attached, the terminal and solder mass are mounted within the connector housing, as represented by step 318. Finally, a reflow process is performed wherein the tail portions of the terminals are aligned with the contact pads on the circuit board and the solder mass and terminal are heated so as to melt the solder mass providing a bond between the tail portion of the terminal and the contact pad of the printed circuit board, as represented by step 320 of FIG. 9.

While the terms up, down, forward, rearward and the like are used herein, it is to be understood that these terms are used for ease in describing the invention and do not denote a required orientation of the connector 20 when mounted to the printed circuit board 28.

While preferred embodiments of the present invention are shown and described, it is envisioned that those skilled in the art may devise various modifications of the present invention without departing from the spirit and scope of the appended claims.

The invention claimed is:

1. An electrical connector, comprising:

a housing;

at least one terminal mounted in said housing, said terminal including a contact portion and a tail portion;

at least one solder mass to be retainingly attached to said tail portion, the retention of the solder mass to the tail portion being enhanced by a plating that covers the solder mass and the tail portion.

2. A connector comprising:

a housing;

at least one terminal mounted in said housing, said terminal including a contact portion and a tail portion;

at least one solder mass attached to said tail portion; and plating substantially covering said tail portion and said solder mass to enhance the attachment of the solder mass to the tail portion.

3. The connector as defined in claim 2, wherein said solder mass is mechanically attached to said tail portion.

4. The connector as defined in claim 2, wherein said solder mass is bonded to said tail portion.

5. An electrical terminal, the terminal comprising:

a contact portion and a tail portion; and at least one solder mass to be retainingly attached to said tail portion, the retention of the solder mass to the tail portion being enhanced by a plating that covers the solder mass and the tail portion.

* * * * *